United States Patent [19]

Tuckerman

[11] Patent Number: 4,674,176

[45] Date of Patent: Jun. 23, 1987

[54] PLANARIZATION OF METAL FILMS FOR MULTILEVEL INTERCONNECTS BY PULSED LASER HEATING

[75] Inventor: David B. Tuckerman, Livermore, Calif.

[73] Assignee: The United States of America as represented by the United States Department of Energy, Washington, D.C.

[21] Appl. No.: 748,375

[22] Filed: Jun. 24, 1985

[51] Int. Cl.⁴ .................. H01L 21/265; C23C 5/00
[52] U.S. Cl. .................................... 29/591; 29/576 B;
29/578; 148/1.5; 148/175; 148/187; 148/DIG. 93; 357/67; 357/71; 427/53.1
[58] Field of Search ............... 29/578, 591, 576 B; 148/1.5, 175, 187; 357/67, 71; 427/53.1

[56] References Cited

U.S. PATENT DOCUMENTS

| | | | |
|---|---|---|---|
| 4,214,918 | 7/1980 | Gat et al. | 148/1.5 |
| 4,249,960 | 2/1981 | Schnable et al. | 148/1.5 |
| 4,258,078 | 3/1981 | Cellar et al. | 427/43.1 |
| 4,259,367 | 3/1981 | Dougherty, Jr. | 427/96 |
| 4,284,659 | 8/1981 | Jaccodine et al. | 427/53.1 |
| 4,305,973 | 12/1981 | Yaron et al. | 148/1.5 |
| 4,327,477 | 5/1982 | Yaron et al. | 29/576 B |
| 4,395,433 | 7/1983 | Nagakubo et al. | 148/1.5 |
| 4,396,458 | 8/1983 | Platter et al. | 156/643 |
| 4,495,255 | 1/1985 | Draper et al. | 427/53.1 |
| 4,541,169 | 9/1985 | Bartush | 29/591 |
| 4,555,301 | 11/1985 | Gibson et al. | 427/53.1 |
| 4,555,843 | 12/1985 | Malhi | 29/576 J |
| 4,561,906 | 12/1985 | Calder et al. | 148/1.5 |
| 4,596,604 | 6/1986 | Akiyama et al. | 148/1.5 |

OTHER PUBLICATIONS

Delfino, M.; IEEE Electr. Dev. Letts. EDL-41 (1983) p. 54.
Raffel et al., IEEE-IEDM Tech. Digest 1980, p. 132.
Sirkin et al., J. Electrochem. Soc. 131 (1984) 123.
Morimoto et al. J. Vac. Sci. Technol. B-3 (May 1983) 857.
Gimpelson et al., Proc. 1984 VLSI—Conf., IEEE, 1984, pp. 37-44.

*Primary Examiner*—Upendra Roy
*Attorney, Agent, or Firm*—Henry P. Sartorio; L. E. Carnahan; Judson R. Hightower

[57] ABSTRACT

In the fabrication of multilevel integrated circuits, each metal layer is planarized by heating to momentarily melt the layer. The layer is melted by sweeping laser pulses of suitable width, typically about 1 microsecond duration, over the layer in small increments. The planarization of each metal layer eliminates irregular and discontinuous conditions between successive layers. The planarization method is particularly applicable to circuits having ground or power planes and allows for multilevel interconnects. Dielectric layers can also be planarized to produce a fully planar multilevel interconnect structure. The method is useful for the fabrication of VLSI circuits, particularly for wafer-scale integration.

26 Claims, 6 Drawing Figures

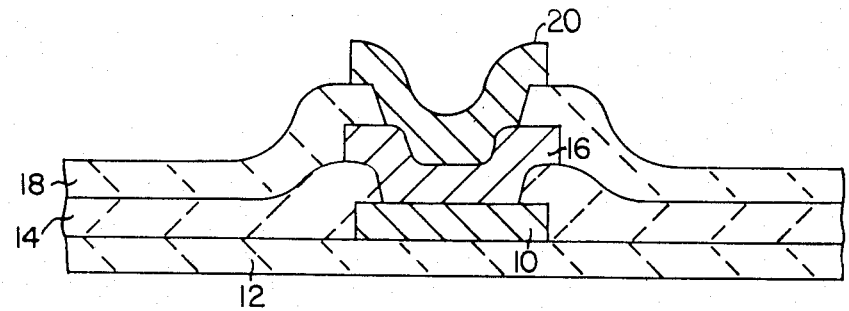
FIG. IA (PRIOR ART)
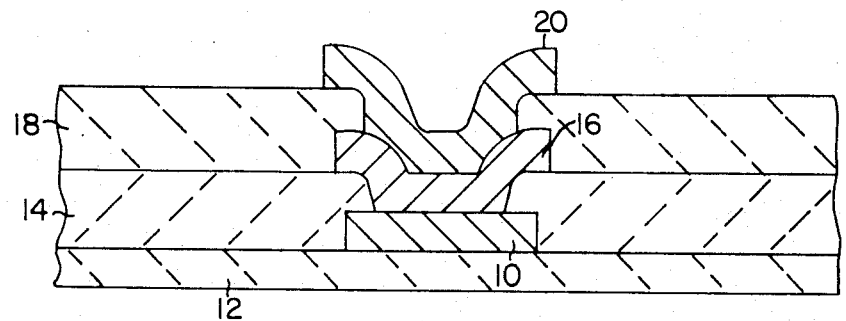
FIG. IB (PRIOR ART)
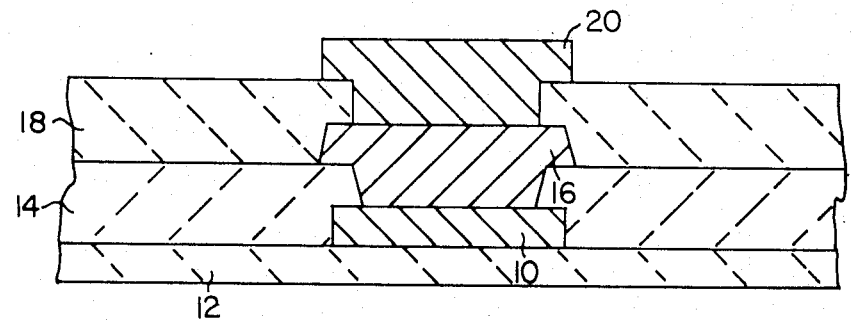
FIG. IC

PLANARIZATION OF METAL FILMS FOR MULTILEVEL INTERCONNECTS BY PULSED LASER HEATING

The United States Government has rights in this invention pursuant to Contract No. w-7405-ENG-48 between the U.S. Department of Energy and the University of California, for the operation of Lawrence Livermore National Laboratory.

BACKGROUND OF THE INVENTION

The invention relates generally to integrated circuit and other electrical interconnection network fabrication and more particularly to the planarization of layers to produce a sufficiently flat topography in fabricating a multilevel structure.

Multilevel interconnect schemes for integrated circuits generally require one or more planarization steps, in order to maintain an acceptably flat topography for lithography and thin-film step coverage on the higher levels. Traditional approaches have involved planarization of the interlevel insulation (dielectric) layers, either by spin-on application (e.g., polyimide), or by reflow (e.g., phosphosilicate glass).

Tne fabrication of multilevel VLSI circuits often requires the use of thin-film planarization procedures. The need is particularly acute to achieve wafer-scale integration; an efficient, high-power wafer-scale integrated system might require four levels of interconnect plus two or more ground or power planes. The most severe topographic problems occur around stacked vias, where a connection extends from the bottom interconnect level to the top level.

Planarization techniques have conventionally involved smoothing the dielectric between the metal layers. Spinning on polyimide as the dielectric is often used to achieve planarity. Other dielectric planarization techniques use bias sputter etching, and still others use photoresist to planarize and then plasma back-etch to the underlying SiO$_2$. Phosphosilicate glass flow can be achieved by furnace heating. Yet another planarization technique uses a scanning cw laser to rapidly flow phosphosilicate glass. None of these tecnniques will planarize a stacked (nested) via, because the dielectric must be removed from the contact area between each level, resulting in a large thickness deficiency at the via.

A high performance VLSI wafer scale multilevel interconnect system is desirable. This system should be compatible with bi-polar logic technology, i.e., provide high current drive capability and high power. It will often be necessary to provide power, ground, clock and reference voltage planes, especially for ECL technology, to provide low ohmic drops and reduced cross talk. Gold metallization is preferred for low electrical resistance; however, silver and aluminum may also be desirable. A SiO$_2$ dielectric is preferred for the reliability and thermal tolerance; glass or otner dielectrics are also useful. The system must provide multiple levels, e.g., five or more, with some vias extending from top to bottom.

Accordingly it is an object of the invention to provide a method for producing an electrical interconnection network.

It is an also an object of the invention to planarize the levels in a multilevel VLSI circuit.

It is a further object of the invention to produce planarized multilevel electrical interconnection network structures.

It is another object of the invention to produce multilevel VLSI circuit structures having power, ground and/or reference voltage planes.

It is yet another object of the invention to provide a method of producing multiple levels, as many as five or more, with vias extending between various levels, including from top to bottom.

SUMMARY OF THE INVENTION

The invention is a planarization method for the fabrication of multilevel integrated circuits or other electrical interconnection networks, and the resulting planar structures, in which each metal level is planarized by melting the metal using a pulsed laser prior to patterning. Short pulses, e.g., about 1 microsecond, are used to preclude undesirable metallurgical reactions between the metal film, any adhesion or barrier layer, and dielectric layer. Laser planarization of metals is particularly well suited to multilevel systems which include ground or power planes.

In particular gold films are planarized on SiO$_2$ dielectric layers (with an adhesion layer) using a pulseu laser, e.g., a flashlamp-pumped dye laser. For a 1 micron layer, the pulse duration is typically about 1 microsecond which allows the heat pulse to uniformly penetrate the gold while not penetrating substantially through the underlying SiO$_2$ hence not perturbing the lower levels of metal. Excellent planarization of the gold films is achieved, less than 0.1 micron surface rougnness (even starting with extreme topographic variations), as well as improved conductivity.

BRIEF DESCRIPTION OF THE DRAWINGS

In the accompanying drawings

FIG. 1A, B, C shows a multilevel structure with nested vias with no planarization (prior art), with dielectric planarization only (prior art), and with both dielectric and metal planarization, respectively.

DETAILED DESCRIPTION OF THE PREFERRED EMBODIMENT

Figure 2:
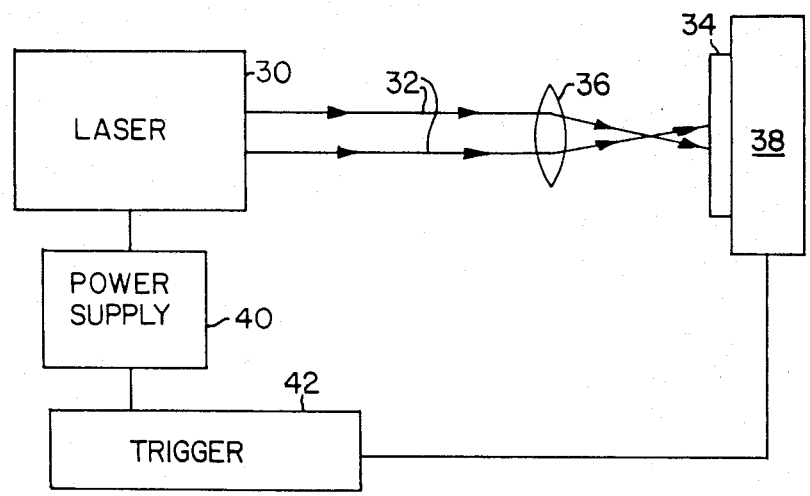
FIG. 2 is a block diagram of apparatus for planarizing metal layers in a multilevel structure.

The invention is a method for achieving planarity in multilevel systems by the planarization of the metal layers, and the resulting planar structures. The metal and dielectric layers are typically of thickness on the order of 1 micron. Planarizing metals by momentarily melting them is feasible because of the very high surface tension (about 50 times that of most nonmetallic liquids) and relatively low viscosity (similar to water) of clean molten metals; the surface tension is the planarizing force while the viscosity is the damping force. Rapid planarization can thus be achieved. Calculating the time-dependent relaxation of low-amplitude, long-wavelength topographic variations in a molten metal surface, neglecting inertial effects (the Reynolds number is low under these conditions), the amplitude of a Fourier component of spatial period L will decay exponentially with a time constant of $\tau = 3 \mu L^4 / 16 \pi^4 65 \, h^3$ where $\mu$, $\gamma$, and h are the dynamic viscosity, surface tension, and thickness of the molten metal. For gold, $\gamma = 1130$ ergs/cm$^2$; experimental data on its viscosity is unavailable so the value for silver, i.e. $\mu = 0.03$ poise, is used. Thus in only 1 microsecond, for a 1 micron thick layer, all Fourier components of the surface topography in molten gold with periods shorter than approximately 21 microns will be virtually eliminated. Since most VLSI structures of interest are much smaller, this would be quite sufficient planarization. A duration of the melt much longer than 1 microsecond may induce unacceptable metallurgical reactions in the thin films. For example, molten aluminum will reduce an SiO$_2$ dielectric to form silicon in a few seconds. As another example, it is estimated, based on typical diffusivities in molten metals, that 1 micron molten gold will completely alloy with a titanium adhesion layer in about 1 ms.

Thus, according to the invention, a very fast (microsecond) heat pulse is optimal for planarizing metals. In general, the heat pulse should be less than 1 ms, and more preferably in the 10 ns-1 microsecond range. Initial experimental tests utilized a high-power scanning electron beam to melt an aluminum line sitting in a silica trench. Excellent silica wetting and partial aluminum planarization was clearly observed. However, rastering a fine electron beam does not produce a perfectly flat surface, because not enough metal area is molten at one time. Therefore, according to the invention, it is preferred to use a pulsed laser to melt a large area, e.g., 4 mm$^2$ of metal with a single pulse.

In contrast with dielectric planarization techniques, the present invention requires that the dielectric be capable of withstanding high temperatures, e.g., SiO$_2$ or some glasses, whereas the planarized metal has a moderate melting point, e.g., Au or Al. Conventional planarization processes often require just the opposite, i.e., a relatively low-temperature dielectric such as polyimide (for spin planarization) or phosphosilicate glass (for thermal planarization) is used with a moderate- or high-temperature metallurgy, e.g., tungsten. Planarization of the metals is advantageous because refractory dielectrics tend to be of higher quality, having few pinholes, greater dielectric strength and higher reliability. Furthermore, for metal interconnect levels, the compelling need is for electrical continuity of the fine wires, and this is easier to achieve with a non-refractory material, which would generally have a high surface mobility at the deposition temperature. Moreover the problem of filling stacked vias is avoided because the planarized metal would be correspondingly thicker over the via area. The invention includes a multilevel interconnect process which uses both laser planarization of metal and also a dielectric planarization process to obtain a fully planar interconnect structure.

Metal planarization combined with dielectric planarization eliminates problems with nested vias as illustrated in FIG. 1A, B, C. A prior art structure with no planarization is shown in FIG. 1A. First gold layer 10 is formed on first dielectric layer 12. A second dielectric layer 14 is then formed and patterned so that a second gold layer 16 is formed in electric contact with first gold layer 10. After patterning the second gold layer 16 a third dielectric layer 18 is added and patterned. Finally, a third gold layer 20 is formed in contact with second gold layer 16 and patterned as desired. The process can be continued in this matter for as many levels as are required. However, the topography of the via formed by the stacked gold layers 10, 16 and 20 which form an electrical interconnect and the adjacent dielectric layers 14 and 18 are irregular. The planarization of the dielectric layers as shown in FIG. 1B provides some improvement but the topography is still irregular and limits the number of levels which may be interconnected. With both metal and dielectric planarization in accordance with the invention, as shown in FIG. 1C, the problem is eliminated; the topography is uniform and there are no steps in the gold layers 16 and 20 or dielectric layers 14 and 18. Multilevel interconnects between many levels can thus be made.

The use of laser planarization of metal films imposes some constraints on the choice of metals and dielectrics. The molten metal must wet the dielectric; this generally requires that the solid metal has good adhesion to the underlying dielectric. Gold films deposited directly on SiO$_2$ do not adhere well, and correspondingly molten gold does not wet SiO$_2$ (contact angle of 140°). In contrast, the customary use of an oxygen-active metal as an adhesion layer, e.g., Cr, Nb, Ti, or Ti$_{0.1}$W$_{0.9}$ alloy gives good adhesion when the gold is solid, and correspondingly excellent wetting in the liquid phase. Aluminum films deposited directly onto SiO$_2$ adhere in the solid phase and wet well in the liquid phase.

In addition to having good adhesion, the metal film should be able to absorb a significant amount of the incident optical power. For this reason, highly reflective metals such as aluminum or silver are more difficult to utilize than gold; gold has greater than 50% absorbance in the green or blue. Thus wavelengths less than about 650 nm are preferred for gold layers. The problem with highly reflective metals is not the energy requirement (simply increase the incident flux), but that when reflectivity is near unity, small changes in surface texture, topography, and composition can radically alter the absorbed power. This can lead to instabilities, in which excess absorbed heat modifies the surface in such a way as to further reduce the reflectance, causing still more optical absorption, until the film is vaporized. However, one solution is to overcoat such metal films with a thin absorbing layer.

Based on the above considerations, gold is the perferred material for laser planarization, although aluminum is also acceptable and silver could be used. Typical layer thicknesses are on the order of 1 micron.

Having chosen the metal, it is necessary to choose the dielectric. It is essential that the dielectric not be damaged by momentary exposure to the overlying molten metal. This probably eliminates organics such as polyimide. The preferred dielectric is pure SiO$_2$, mainly because its physical properties are desirable and well characterized; some glasses can also be used. For the Au/SiO$_2$ multilevel system, an adhesion layer such as Cr, Ti or W is necessary at every interface between the two materials.

Once the metal/dielectric system is chosen, the heat pulse can then be optimized. The optical absorption depth in Au or Al is so short, 200 Å at typical wavelengths, that the heat is generated essentially at the surface of the metal film. The heat will diffuse a depth $z = (\alpha t)^{\frac{1}{2}}$ in time t, where $\alpha$ is the thermal diffusivity of the gold (1.0 cm$^2$/s at 700° C.). It therefore takes only 10 ns for most of the heat to penetrate through a micron of gold. A somewhat longer pulse width is desirable in order to allow sufficient metal flow over a sufficiently large area, e.g., a 20 micron spatial period. For a 1 microsecond heat pulse, the gold may be considered to be nearly in thermal equilibrium during the pulse (relatively small vertical temperature gradients). The underlying SiO$_2$ dielectric has a much lower thermal diffusivity, $\alpha=0.032$ cm$^2$/sec. This is useful for two reasons: the underlying layers are exposed to much lower temperatures than is the surface, and the pulse energy required to achieve complete melting is minimized. The minimum absorbed energy needed to melt 1 micron of Au on top of a 1 micron SiO$^2$ layer on a silicon wafer ranges from 0.4 J/cm$^2$ at 10 ns pulse duration, rising gradually to 0.8 J/cm$^2$ for a 1 microsecond pulse, and thereafter increasing approximately as the square root of the pulse duration (due to heat penetration into the silicon substrate). A pulse shorter than 10 ns would not be useful, because large thermal gradients would be generated in the gold layer, vaporizing the surface before the bottom of the film reaches its melting point. A pulse up to 1 ms may be used in some circumstances. For laboratory work these energies must be doubled to account for the approximately 50% reflectance of the gold. These energies are minimums; in practice operation at somewhat higher values is necessary to allow for cold spots in the beam. The laser planarization process for the Au/SiO$_2$ interconnect system has been calculated and experimentally verified to have a large operating window for a pulse length of 1 microsecond. Energies can typically be increased a factor of two above the minimum values without significant film vaporization or damage.

As described the preferred pulse length is primarily chosen as a function of the heat flow characteristics, i.e., the thickness of the dielectric layer. The laser pulses of predetermined pulse-width are stepped or rastered over the surface of a metal layer. The beam spot size is much greater than the spatial period of any surface features of the layer, e.g., 2 mm compared with 20 microns. The beam spot is rastered generally in an overlapping pattern, e.g., 1 mm steps for 2 mm diameter spot size. Often a single laser pulse of predetermined width is sufficient at each incremental step on the surface of the metal layer. However, the invention also includes utilizing several pulses at each step; in particular, for long period features it may be necessary to utilize more than a single pulse in order to achieve planarization. Lengthening the pulse is not generally advantageous since it is limited by the heat flow characteristics of the layer, but the use of multiple pulses of the predetermined effective pulse width can be advantageous.

In one particular apparatus for carrying out the invention, shown in FIG. 2, a pulsed laser 30, e.g., a linear flashlamp-pumped dye laser containing a coumarin dye, is used to supply optical pulses at 504 nm, of which 48% is reflected by the gold films. The pulses have 1 microsecond duration (full width at half maximum), 150 mJ of energy, and 1 Hz repetition rate. The beam 32 is focused to a 2 mm diameter spot on the wafer 34 by means of lens 36. No effort is made to make the spot uniform in intensity; consequently about half of the pulse energy (around the beam circumference) is below the melt threshold and hence wasted. By adjusting the distance between the wafer 34 and lens 36 the spot size can be varied; the wafer is preferably positioned at a point beyond the focal point of lens 36 rather than before the focal point. X-Y translation stages 38 are configured with stepping motors to translate the wafer 34 mounted thereon between pulses; typically the pulses are spaced 1 mm apart so there is considerable overlap. Laser 30 is powered by power supply 40 which is pulsed by trigger 42 to produce pulses of laser radiation. Trigger 42 also controls X-Y stages 38 so that the laser spot is stepped across the surface of wafer 34. An alternate more efficient and versatile arrangement would be to homogenize the beam, e.g., by means of a kaleidoscope.

Figure 3A:
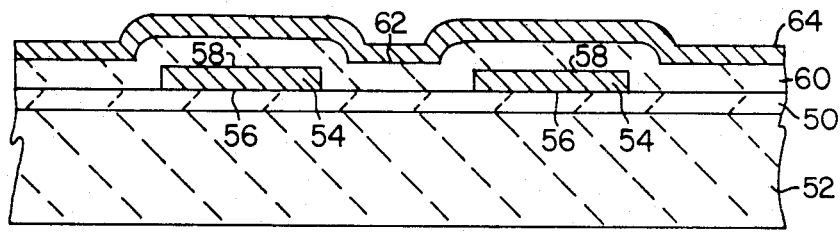
FIG. 3A and B shows a multilevel strucuture in the form of microstrips covered by a ground plane before and after planarization of the metal layer, respectively.
Figure 3B:
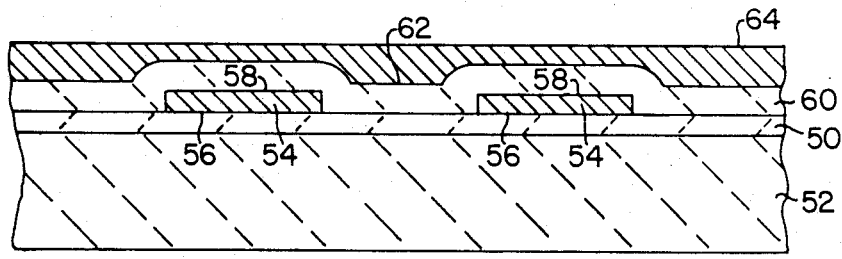

Experiments were mostly performed on sputter-deposited gold films on SiO$_2$ dielectric layers. Initially, the underlying substrates were bare silicon wafers. Later work deposited a gold pattern ("metal level 1") with a pitch of 4, 8 or 16 microns onto thermally grown SiO$_2$, then coated the gold with a second SiO$_2$ layer by chemical vapor deposition, and finally sputter-deposited an upper layer of gold ("metal level 2"). It is important to deposit suitable adhesion layers at the Au/SiO$_2$ interfaces (e.g., Cr, Nb, or Ti$_{0.1}$W$_{0.9}$) or else the structures will fail when pulsed with heat. The results of the planarization procedure are illustrated in FIGS. 3A and B which illustrate structures in the form of microstrips (transmission lines) covered by a ground plane. A first dielectric layer 50 of SiO$_2$ is formed on a substrate 52 of silicon. A first layer of gold 54 is formed on dielectric layer 50 with a very thin adhesion layer 56 in between. Metal layer 54 is then patterned into a pair of parallel lines, for example, 7 microns wide, 1 micron thick on 16 micron centers. Gold layer 54 is then coated with a second dielectric layer 60, with another thin adhesion layer 58 therebetween. Finally, dielectric layer 60 is coated with a thin adhesion layer 62 and a second gold layer 64 which forms a ground plane. FIG. 3A shows ground plane 64 before planarization; FIG. 3B shows ground plane 64 after planarization. Laser planarization of metal level 64 had no apparent effect on the underlying metal level 54, due to the thermal barrier presented by the SiO$_2$ dielectric layer 60. In principle this process could be repeated: coating with SiO$_2$, opening contact windows, coating with Au, laser planarizing, patterning the Au, coating with SiO$_2$, etc. After each level of Au is deposited, the planarity of the surface is restored by laser planarization.

The wafers were exposed to ambient air during the planarization process; no adverse effects appear to be associated with this procedure. In the case of aluminum, which oxidizes easily, it is possible to operate in an oxygen-free environment, but satisfactory results were obtained with aluminum without doing so. A few experiments were done using a KrF excimer laser as the pulse source, but the 10 ns pulse gave a substantially reduced operating window between melting and damage, compared with the factor of two window available with the 1 microsecond pulsed dye laser.

As is evident from FIGS. 3A and B the planarization process was very successful. The CVD and sputtering processes used to deposit the SiO$_2$ and Au produced extreme step coverage problems, yet the planarized gold is smooth and flat to better than 500 Å. No changes whatsoever were noticeable in the lower SiO$_2$ or gold layers. This indicates that the process should be readily adaptable to more levels of metal.. The geometries shown were particularly challenging cases, for the gold in these examples was barely thick enough to cover the higher regions after the planarization has been accomplished. The difficulty of planarization, i.e., melt time required, varies as $h^{-3}$, where h is the metal film thickness. Thicker gold films flow much more easily. Good results were obtained with a relatively thick 1.6 micron gold film on a silicon wafer etched with vertical grooves and coated with 0.4 micron SiO$_2$.

The deposited dielectric layers should have low internal stress for the planarization process to be successful. For example, sputter-deposited SiO$_2$ tended to be much more highly stressed than CVD-deposited $SiO_2$. Multilayer structures using the sputtered $SiO_2$ were found to rupture during laser planarization. For designing a multilevel metal process, it is important to understand what physical changes (besides the obvious topographic ones) occur in the metal films due to the laser planarization process.

One concern is whether the adhesion layer at the $Au/SiO_2$ interface diffuses significantly into the gold while the latter is molten. Using Secondary Ion Mass Spectroscopy (SIMS) depth profiling to study planarized gold samples having adhesion layers of Cr, Nb, and $Ti_{0.1}W_{0.9}$, no radical movement of any adhesion layer was observed. While it is difficult to draw quantitative conclusions from SIMS data, it appears that each type of adhesion layer exhibited a small amount of diffusion into the gold (i.e., a Gaussian-like impurity tail was observed penetrating up into the gold). The concentration levels appear to be in the parts per million when more than about 0.2 microns from the adhesion layer. The fastest diffuser was titanium, which produced a weak but measurable signal as far as 0.5 microns from the interface. The slowest diffuser was tungsten, which did not diffuse measurably into the gold. Since the diffusivities of impurities in molten metals are typically between $10^{-4}$ and $10^{-5}$ cm$^2$/s at 1100° C., this confirms that the gold could only have beem molten for at most a few microseconds. None of these impurity levels are considered significant for multilevel interconnect purposes. The chemical etching properties of the gold appear unaffected by the planarization process.

No change in average thickness of the films was observed at normal power levels. Thus there is no significant vaporization of the films during planarization, even when the same area is pulsed repetitively.

The average grain size of the gold films increased substantially after laser planarization, from about 0.3 microns as deposited to 1 or 2 microns after planarization. However, this did not interfere with the ability to chemically etch the gold with edge roughnesses much less than a micron. In fact, the planarized gold is easier to pattern accurately because it is smoother than the sputtered films. The greater the incident optical pulse energy, the larger the grain size, probably because these areas have more thermal energy stored in the substrate, hence the cooling time is longer, which allows more opportunity for grain growth before the temperature drops too low. Compared with sputter-deposited films, the texture is very smooth (100 Å roughness). X-ray diffraction showed that the planarized grains are oriented almost exclusively in the <100> direction, regardless of initial orientation (which was <111> for sputter deposition).

Adhesion of the planarized gold films is better than before planarization. In all cases resulting tensile strengths were greater than 5000 psi. In many cases the final failure occurred in the silicon substrate rather than the $Au/SiO_2$ interface.

The sheet resistance of the planarized films was determined by 4-point probing, and was found to be approximately 12% lower than before planarization. Typical room-temperature resistivities were 2.95 $\mu\Omega$-cm before planarization, and 2.6 $\mu\Omega$-cm after planarization. This is not far from the bulk value of 2.2 $\mu\Omega$-cm, which would be the lowest possible value. Presumably this reduction in resistance is due to the larger grain size, which reduces electronic scattering.

All of the above physical properties appear to be independent of the number of pulses; i.e., there is no advantage or disadvantage to using multiple planarization pulses. The only defects which appear to result from laser planarization occurred in areas of poor adhesion, presumably where the $SiO_2$ substrate was contaminated prior to the Au deposition. In such spots, the poor heat transfer results in overheating and vaporization of the spot, leaving a crater approximately 10 microns in diameter. In addition to these defects, there is a visible artifact which occurs at the border of the melted area, presumably due to a slight difference in level between the planarized and unplanarized area. This is typically very small, about 100 Å.

Laser planarization of the metal layers thus offers an attractive technique for fabricating multilevel interconnect structures, particularly where a number of ground or power planes are included. The $Au/SiO_2$ combination is well suited to laser planarization, although successful results were also achieved with the $Al/SiO_2$ combination. Two levels of metal have been demonstrated, but this process can be extended to circuits containing a large number of interconnect levels and ground/power planes by planarizing after each metal level is deposited. The technique can be used by itself, or it can be combined with a compatible dielectric planarization process to make truly planar multilevel interconnect structures.

Changes and modifications in the specifically described embodiments can be carried out without departing from the scope of the invention which is intended to be limited only by the scope of the appended claims.

I claim:

1. In a method of fabricating an integrated circuit structure having a thin metal layer deposited on an insulating layer or substrate, the step of planarizing the metal layer by heating the metal layer to momentarily melt the layer for a time sufficient to substantially eliminate topographic variations of less than a preselected spatial period to produce a flat surface on the metal layer without reacting or alloying the metal layer with the insulating layer or substrate, the planarizing occurring prior to patterning the layer.

2. The method of claim 1 for the fabrication of a multilevel integrated circuit structure.

3. The method of claim 1 wherein the duration of the melt is sufficient to melt the metal without vaporization, allow metal flow over a preselected area, and prevent damage to any underlying layer.

4. The method of claim 1 wherein heating the metal layer is performed by applying pulsed laser radiation to the surface of the layer.

5. The method of claim 3 wherein the duration of the melt is less than about 1 millisecond.

6. The method of claim 4 wherein the pulsed laser radiation has a pulse duration of less than about one millisecond.

7. The method of claim 4 further including stepping the pulsed laser radiation over the surface of the metal in a series of incremental steps.

8. The method of claim 4 for a gold layer wherein the laser radiation has a wavelength of less than about 650 nm.

9. The method of claim 6 for a gold layer of about 1 micron in thickness wherein the pulse duration is in the range of about 10 nanoseconds to about 1 microsecond.

10. The method of claim 7 wherein a single pulse of laser radiation is applied at each incremental step.

11. The method of claim 7 wherein a plurality of pulses of laser radiation are applied at each incremental step.

12. A method of fabricating an electrical interconnection network, comprising:
forming in sequence a plurality of alternating layers of metals and dielectric materials;
planarizing each metal layer to produce a flat surface prior to patterning the layer and prior to forming an additional dielectric layer;
patterning each metal layer and dielectric layer in a preselected pattern prior to forming an additional layer.

13. The method of claim 12 wherein the step of planarizing each metal layer is performed by heating the metal layer to momentarily melt the layer to produce a flat surface.

14. The method of claim 12 further including:
forming the metal layers of a low melting point metal;
forming the dielectric layers of a high temperature refractory dielectric material.

15. The method of claim 12 further including
forming the metal layers of gold;
forming the dielectric layers of $SiO_2$ or glass; and
forming an adhesion layer of an oxygen active metal alloy between the gold and dielectric layers which is much thinner than the gold or dielectric layers.

16. The method of claim 12 further including planarizing each dielectric layer prior to pattering the dielectric layer or forming an additional metal layer.

17. The method of claim 13 wherein the duration of the melt is sufficient to melt the metal layer without vaporizing the layer or damaging any underlying layer and to allow metal flow over a preselected area.

18. The method of claim 13 wherein the step of planarization is performed by irradiating the layer with pulses of laser radiation.

19. The method of claim 15 wherein the step of planarization is performed by irradiating the gold layers with laser pulses having a wavelength of less tnan about 650 nm.

20. The method of claim 17 wherein the duration of the melt is less than about 1 millisecond.

21. The method of claim 17 for a gold layer of the order of 1 micron in thickness wherein the duration of the melt is in tne range of about 10 nanoseconds to about 1 microsecond.

22. The method of claim 18 wherein the step of planarization is performed by irradiating the layer with laser pulses of less than about 1 millisecond duration.

23. The method of claim 18 further including stepping the pulses of laser radiation over the metal layer in a series of incremental steps.

24. The method of claim 22 for a gold layer of the order of 1 micron thickness, wherein the pulse duration is in the range of about 10 nanoseconds to about 1 microsecond.

25. The method of claim 23 wherein a single pulse is applied at each incremental step.

26. The method of claim 23 wherein a plurality of pulses are applied at each incremental step.

* * * * *